United States Patent [19]

Chang

[11] Patent Number: 5,313,419
[45] Date of Patent: May 17, 1994

[54] SELF-ALIGNED TRENCH ISOLATION SCHEME FOR SELECT TRANSISTORS IN AN ALTERNATE METAL VIRTUAL GROUND (AMG) EPROM ARRAY

[75] Inventor: Ming-Bing Chang, Santa Clara, Calif.

[73] Assignee: National Semiconductor Corporation, Santa Clara, Calif.

[21] Appl. No.: 12,037

[22] Filed: Feb. 1, 1993

[51] Int. Cl.$^5$ ............................................. G11C 11/40
[52] U.S. Cl. ................................. 365/182; 365/184; 365/185; 365/51
[58] Field of Search ................... 365/182, 184, 185, 51

[56] References Cited

U.S. PATENT DOCUMENTS 5,099,297  3/1992  Hazani ................................. 365/185

OTHER PUBLICATIONS

Boaz Eitan, et al.; Alternate Metal Virtual Ground (AMG)-A New Scaling Concept for Very High-Density EPROMS; IEEE 1991; vol. 12, No. 8, Aug. 1991, pp. 450-452.

R. Kazerounian, et al.; Alternate Metal Virtual Ground EPROM Array Implemented in a 0.8 μM Process for Very High Density Applications; IEDM 1991; pp. 311-314.

Graham R. Wolstenholme et al.; A Novel Isolation Scheme for Implementation in Very High Density AMG EPROM and Flash Arrays.

*Primary Examiner*—Terrell W. Fears
*Attorney, Agent, or Firm*—Limbach & Limbach

[57] ABSTRACT

The present invention provides a self-aligned trench isolation scheme for the MOS select transistors in an alternate metal virtual ground (AMG) EPROM array architecture. The new isolation scheme allows bit line to bit line spacing to be scaled to 0.6 μm and below without compromising either data retention or memory performance characteristics. A new poly stack self-aligned etch scheme is also provided to scale the word line spacing to 0.6 μm and below and, thus, allow a 64 Mbit EPROM array to be realized.

4 Claims, 6 Drawing Sheets

5,313,419

SELF-ALIGNED TRENCH ISOLATION SCHEME FOR SELECT TRANSISTORS IN AN ALTERNATE METAL VIRTUAL GROUND (AMG) EPROM ARRAY

BACKGROUND OF THE INVENTION

1. Field of the Invention

The present invention relates to electrically programmable read only memory (EPROM) arrays and, in particular, to an alternate metal virtual ground (AMG) EPROM array that utilizes self-aligned trench isolation for achieving bit line isolation between select transistors without compromising memory performance.

2. Discussion of the Prior Art

Both R. Kazerounian et al., "Alternate Metal Virtual Ground EPROM Array Implemented In A 0.8 Micron Process For Very High Density Applications", IEDM, p. 311, 1991, and B. Eitan et al., "Alternate Metal Virtual Ground (AMG)—A New Scaling Concept For Very High-Density EPROMs", IEEE Electron Device Letters, Vol. 12, p. 450, 1991, disclose an AMG EPROM architecture that transfers the layout scaling limitation of the array from the metal pitch to the polysilicon pitch by strapping alternate diffusion bit lines and by employing select transistors. Utilizing this array architecture, an EPROM cell size of 2.56 $\mu m^2$ with 0.8 $\mu m$ layout rules can be realized for high density memory applications, e.g. 4 Mbits and beyond.

A further advantage associated with the AMG array architecture is that, by utilizing MOS select transistors, drain turn-on induced punch-through can be minimized.

The MOS select transistors in a conventional AMG array are isolated utilizing a conventional LOCOS isolation scheme. As shown in FIG. 1, with 0.8 $\mu m$ layout rules, bit line-to-bit line spacing is only 0.8 $\mu m$, which is much less than the isolation spacing of 1.2 $\mu m$ required to form a minimum-sized field oxide island. Furthermore, as can be seen from the FIG. 2 layout, poly1 to field oxide island misalignment, the field oxide rounding effect at concave corners, and field oxide thinning with reduced nitride spacing prevent simple scaling of an AMG array below 0.8 $\mu m$ design rules.

Recently, Wolstenholme et al. proposed a scheme that utilizes programmed EPROM cells to achieve bit line isolation. As shown in FIG. 3, to implement the Wolstenholme et al. isolation scheme, the MOS select transistors utilized in the conventional AMG architecture are replaced by EPROM cells which are the same as the EPROM cells used in the memory array. Along each select line Sel and $\overline{Sel}$, every other EPROM cell is programmed to a high threshold voltage ($V_{th}$) state to achieve bit line to bit line isolation. These programmed EPROM cells are depicted in FIG. 3 with a solid dot between the control gate and the floating gate.

SUMMARY OF THE INVENTION

The present invention provides a self-aligned trench isolation scheme for providing isolation between MOS select transistors in an alternate metal virtual ground (AMG) EPROM array architecture. The select transistor isolation scheme allows improved bit line scaling over conventional LOCOS isolation techniques.

Utilizing the new self-aligned trench isolation scheme, bit line to bit line isolation spacing in the AMG EPROM array can be scaled down to 0.6 $\mu m$ and below without compromising either data retention or memory performance. A detailed process flow to implement an N$^-$ source for the EPROM cells and trench isolation between select transistors is also disclosed. Using this process, both poly topography and bit line/word line capacitance can be significantly reduced. In addition, a new poly stack self-aligned etch (SAE) scheme is presented. With this new SAE scheme, much better poly2 critical dimension (CD) control can be achieved and poly1 bridging can be eliminated without relying on tight photo/etch process controls. Therefore, word line to word line spacing of an AMG EPROM array can also be scaled down to 0.6 $\mu m$ and A better understanding of the features and advantages of the present invention will be obtained by reference to the following detailed description and accompanying drawings which set forth an illustrative embodiment in which the principles of the invention are utilized.

DETAILED DESCRIPTION OF THE INVENTION

The present invention provides a self-aligned trench isolation scheme for acheiving 0.8 $\mu m$ isolation spacing between the MOS select transistors in an alternate metal virtual ground (AMG) EPROM array.

Figure 4:
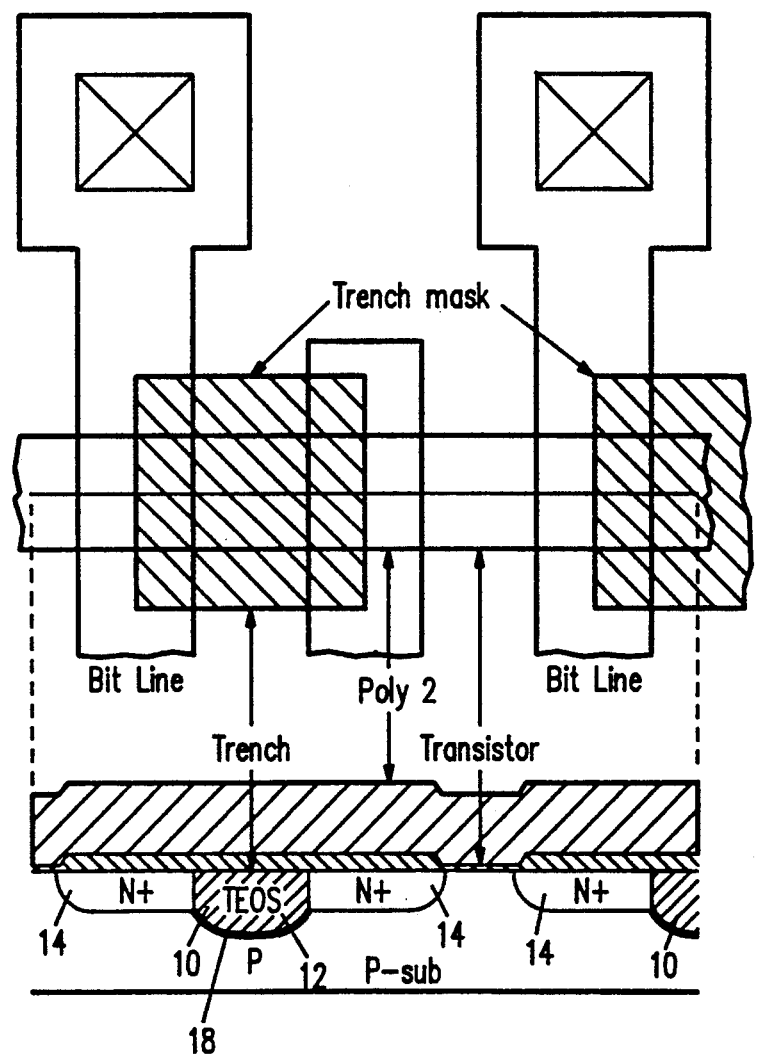
FIG. 4 is a combined layout and cross-sectional drawing illustrating the select transistor portion of an AMG EPROM array that utilizes a trench isolation concept in accordance with the present invention.

As shown in FIG. 4, in accordance with the present invention, 0.5 $\mu m$ deep trenches 10, which are self-aligned to the bit line oxide, are etched and then filled with deposited oxide 12 to achieve isolation between the N$^+$ bit lines 14. In this trench isolation scheme, as in the original AMG architecture described above, the select transistors 16 are implemented utilizing regular MOS transistors, as shown in FIG. 5.

Figure 1:
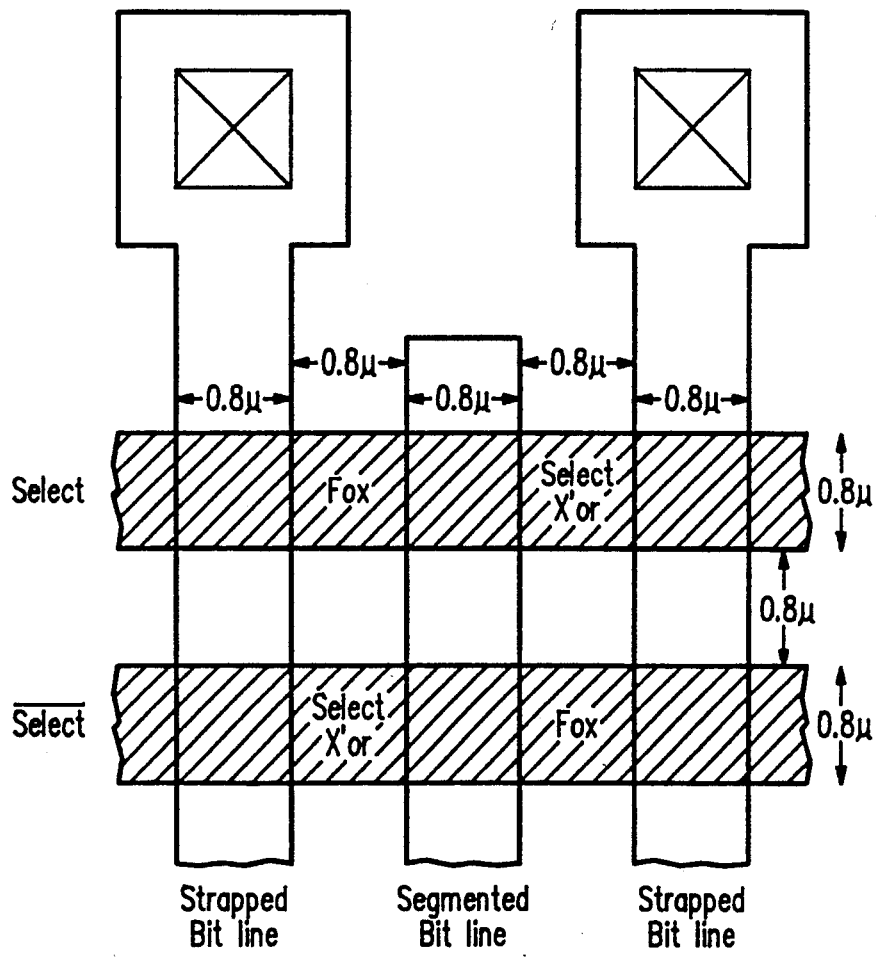
FIG. 1 is a partial layout drawing illustrating a portion of a conventional AMG EPROM array select transistor layout utilizing 0.8 $\mu m$ layout rules.
Figure 2:
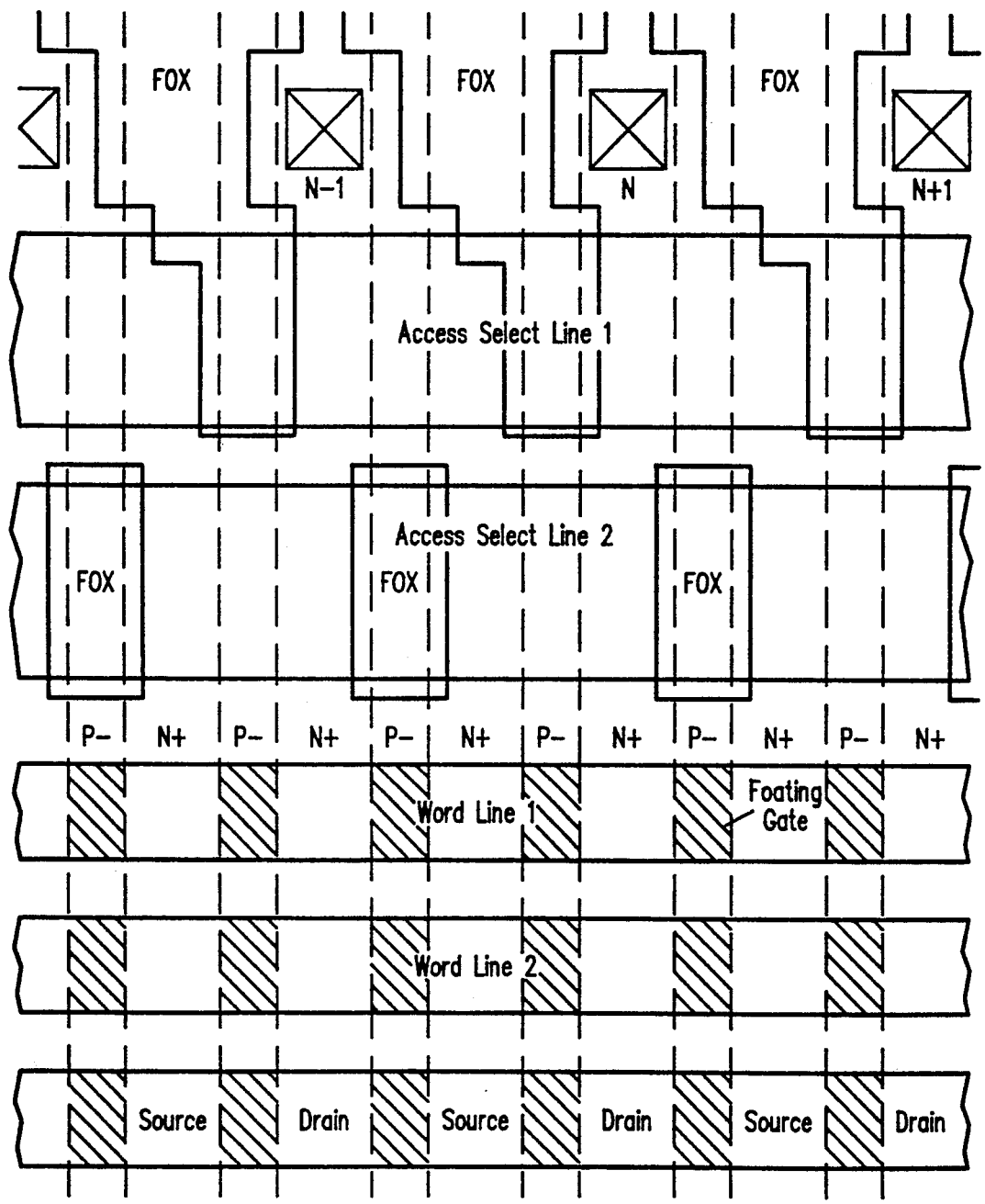
FIG. 2 is a partial layout illustrating a portion of a conventional AMG EPROM array including select transistors and a portion of the cell array.
Figure 5:
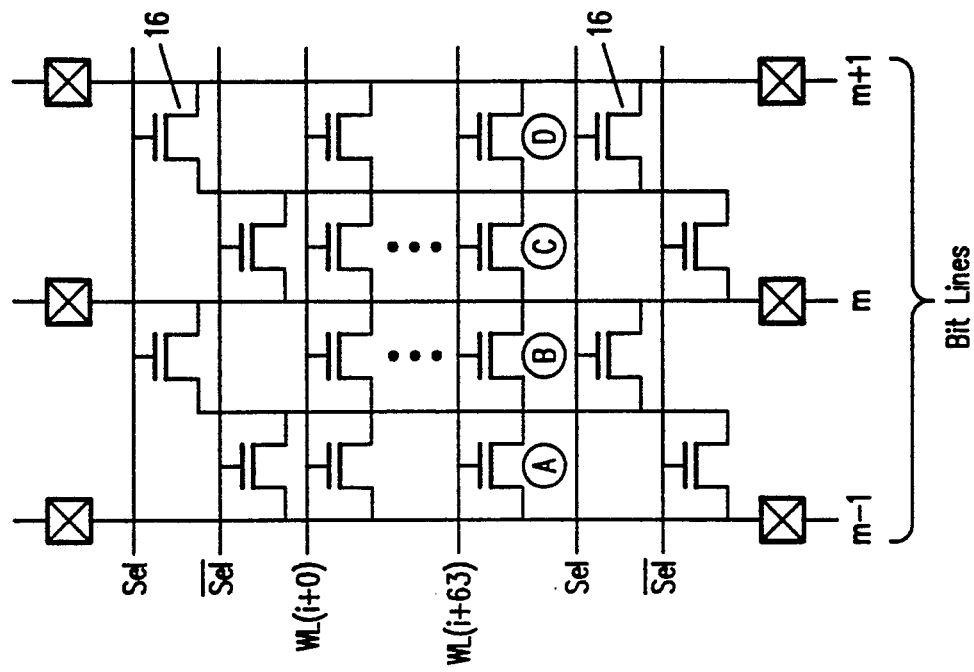
FIG. 5 is a schematic diagram illustrating portions of an AMG EPROM array wherein isolation between MOS select transistors is achieved with self-aligned trenches in accordance with the present invention.
Figure 3:
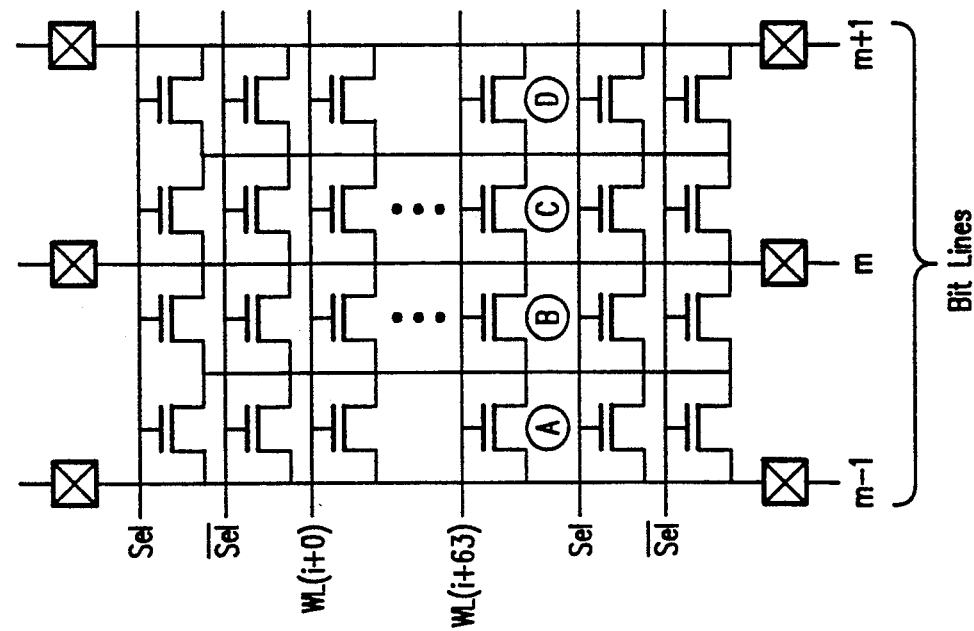
FIG. 3 is a schematic diagram illustrating a portion of an AMG EPROM array that utilizes programmed EPROM cells for isolation between select transistors.

Referring to FIG. 5, to write cell B, select line $\overline{Sel}$ can be biased at 12V to effectively short the source and the drain of cell C together. Thus, cell C is prevented from being unintentionally written. Cell D can be prevented from being unintentionally written by implementing an N− implant and an N+ pullback at the segmented bit lines. Also, because of a high select line bias, cell programmability can be enhanced because of the low voltage drop across the select transistor. Similarly, cell read current and memory performance can be enhanced because of an effective 5V select gate drive during a read operation.

A process flow for implementing trench isolation for the select transistors and N− source for the EPROM cells in accordance with the concepts of the present invention will now be described in conjunction with FIG. 4 and 6.

Following conventional fabrication steps through the formation of a 250 Å cell gate oxide layer 102 on an underlying P-type silicon substrate 100, a layer of polysilicon (poly1) is deposited and doped to the appropriate conductivity. Next, a thin layer of nitride about 100 Å thick and a thin layer of polysilicon approximately 100 Å thick are deposited on the poly1. A floating poly mask is then formed on the thin poly/thin nitride/poly1 stack and the stack is etched back to the cell gate oxide to define parallel spaced-apart strips of thin poly/thin nitride/poly1. A bit line N− blanket implant is then performed, followed by an N+ implant into only the strapped bit lines using one additional mask. Next, a 1500 Å thick TEOS oxide is deposited and etched back to form a sidewall spacer on the thin poly/thin nitride/poly1 strips. The spacer etch back stops on the thin poly and the N− diffusions in the silicon substrate. The sidewall spacer is then utilized to perform a N+ blanket implant for the source bit lines. A differential oxide step is then performed to grow bit line oxide about 800 Å thick on the N+ doped bit lines and to convert the thin poly to thin oxide.

Next, as shown in FIG. 4, a trench mask is formed to expose selected regions of the select transistor portion of the EPROM device structure. The thin oxide/thin nitride/poly1/gate oxide within the trench mask is then etched back to the underlying silicon substrate, leaving about 200 Å of bit line oxide on the N+ bit lines. Then, in accordance with the concepts of the present invention, a 0.5 $\mu$m deep trench 10, which is self-aligned to the bit line oxide, is etched in the silicon substrate. The trench 10 is then implanted with boron followed by the growing of trench heal oxide about 100 Å thick. This is followed by the deposition of a 0.6 $\mu$m TEOS oxide. A planarization etch back is then performed which stops on the poly1 and leaves about 2,000 Å of oxide on the bit lines. By implementing a planarization etch back after filling the trench, the polysilicon topography can be significantly reduced. Furthermore, a thick oxide layer between the bit line and the word line not only reduces bit line capacitance and enhances memory performance but also reduces bit line noise during sensing because of a low bit line/word line coupling.

Next, an oxide/nitride/oxide (ONO) layer is formed. A mask is then formed to protect the floating gates in the array and the trenches in the select transistor region. The ONO/poly1 is then etched in the select transistor and peripheral device regions. The cell gate oxide is then striped and peripheral and select transistor gate oxide is grown. Next, a second layer of polysilicon (poly2) is formed followed by an overlying layer of tungsten silicide. Then, a TEOS layer approximately 1,000 Å thick, which is to be used as a hard mask in the poly stack self-aligned etch (SAE), is deposited. Using the poly2 mask, the TEOS/silicide/poly2 stack is etched and stops on the ONO and oxide for the poly1 area and the bit line area, respectively. After stripping the poly2 mask photoresist, an SAE mask is formed to protect the select transistor area and the peripheral region while exposing the cell array. The ONO/poly1 strips are then etched using the TEOS layer as a hard mask to define parallel islands of ONO and underlying floating gate poly1 on the gate oxide in the cell array portion of the device structure.

Figure 6:
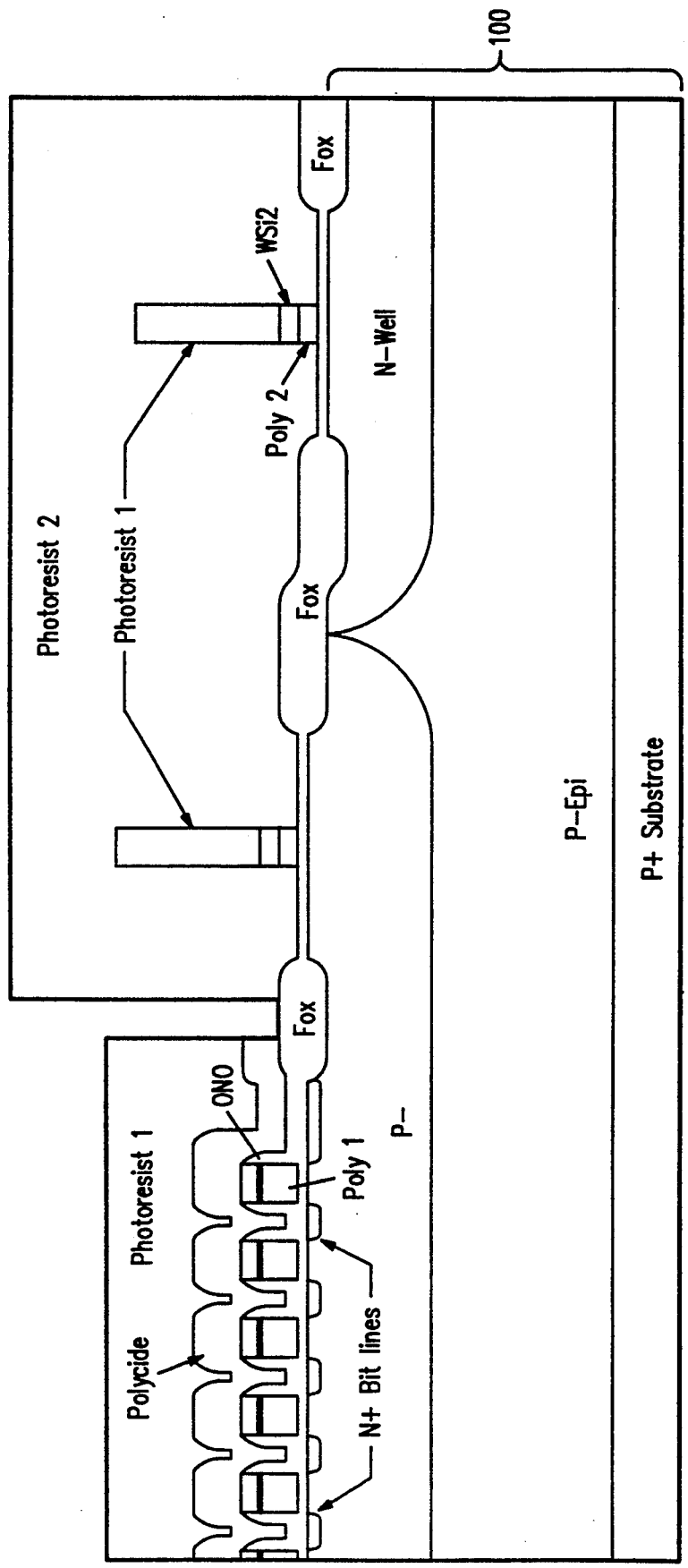
FIG. 6 is a cross-sectional view illustrating a poly1 self-aligned etch utilizing a double photoresist technique.

As shown in FIG. 6, rather than using the TEOS layer as a hard mask as described above, the poly stack self-aligned etch (SAE) can be implemented utilizing a double photoresist process. In this double resist process, after etching the silicide/poly2 stack, the poly2 resist is hardened with deep UV. Then, a second layer of photoresist is spun on top of the hardened poly2 resist. This double layer resist is exposed with the SAE mask to open the cell array area for an ONO/poly1 stack etch to define the ONO/poly1 floating gate islands.

However, there are drawbacks to the double resist process. First, if the SAE mask is underexposed, residual resist between word lines can cause poly1 bridging. Since resist thickness is typically thicker than 1 $\mu$m and, in addition, the combined silicide/poly2 thickness is over 0.5 $\mu$m while word line spacing is only 0.8 $\mu$m, the residual resist between word lines cannot be cleaned up without overexposing the top resist. Second, if the SAE mask is overexposed, then poly2 critical dimension loss occurs even though the poly2 resist is hardened with deep UV. Because of these constraints, further word line scaling is very difficult. Thus, in order to obtain better poly2 CD control and to enable the word line spacing to be scaled down to 0.6 $\mu$m and below, the above-described SAE etch scheme using the TEOS layer as a hard mask is preferred.

In either case, i.e. TEOS hard mask or double resist, processing then continues in accordance with conventional techniques to complete the AMG EPROM device structure.

Figure 7A:
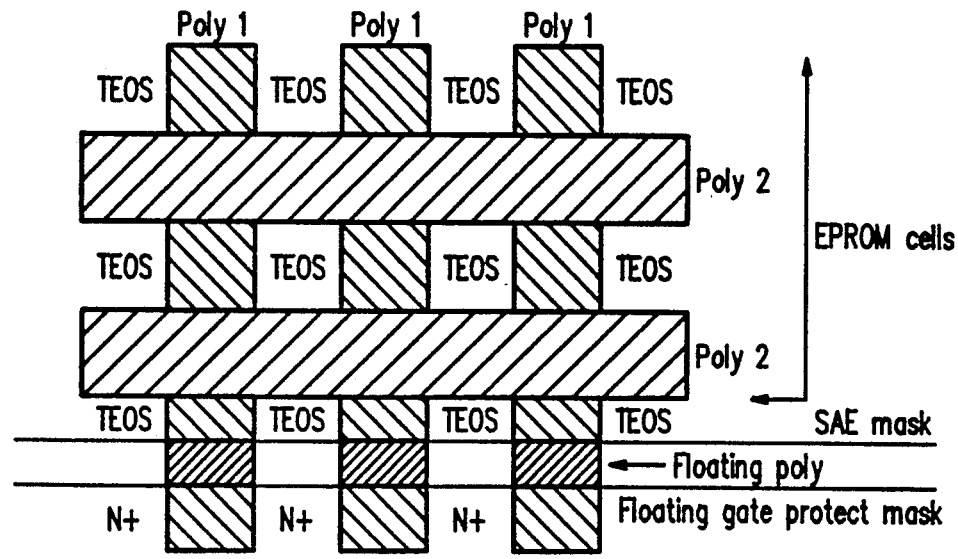
FIG. 7A is a plan view illustrating residual floating polysilicon islands between bit lines resulting from possible misalignment between the floating gate protect mask and the SAE mask in an AMG fabrication process.
Figure 7B:
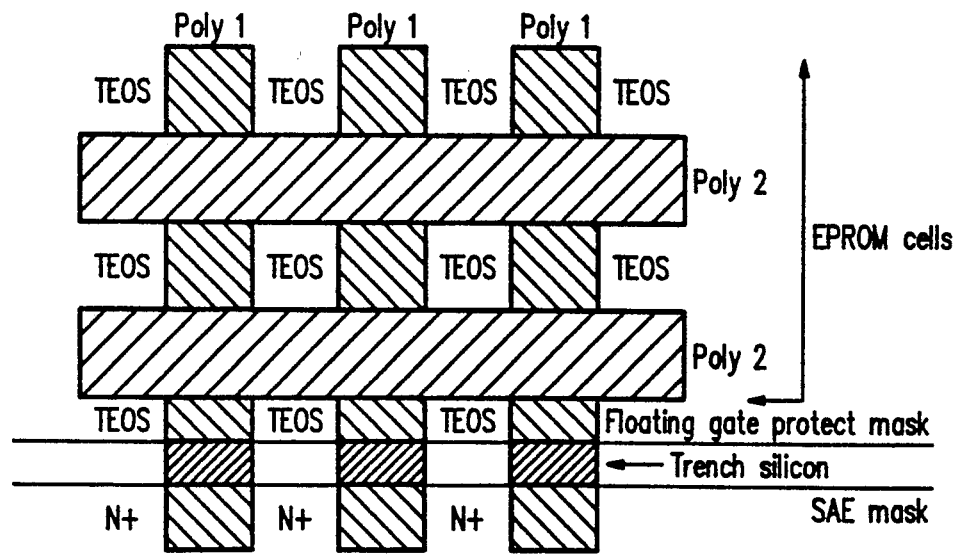
FIG. 7B is a plan view illustrating residual silicon trenches between bit lines resulting from misalignment between the floating gate protect mask and the SAE mask in an AMG fabrication process.

In implementing the AMG EPROM architecture described above, an issue associated with boundaries between EPROM cells and select transistors needs to be addressed. If there is misalignment between the floating gate protect mask and the SAE mask, then either residual floating poly islands or silicon trenches occur between the bit lines, depending on the relative location of these masks, as shown in FIG. 7A and 7B, respectively. Due to a coupling from the bit lines, drain turn-on voltage decreases when a residual floating poly island exists between bit lines. In order to achieve bit line to bit line isolation, silicon trenches deeper than the bit line N+ junction depth are required, as shown in FIG. 7B and FIG. 8.

Figure 8:
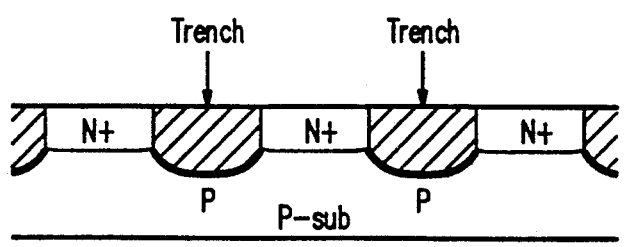
FIG. 8 is a cross-sectional view illustrating the silicon trench of FIG. 7B for bit line to bit line isolation.

FIG. 8 shows a cross-section along these silicon trenches. Since these trenches are created during the SAE etch, they can be achieved without any extra process steps. As shown in FIG. 8, and as stated above, bit line to bit line isolation can be further enhanced with an additional boron implant to create a P-type region between bit lines.

It should be understood that various alternatives to the embodiments of the invention described herein may be employed in practicing the invention. It is intended that the following claims define the scope of the invention and that methods and apparatus within the scope of these claims and their equivalents be covered thereby.

What is claimed is:

1. An alternate metal virtual ground (AMG) EPROM device structure formed in a silicon substrate of P-type conductivity, the device structure including both a cell array portion that includes a matrix of rows and columns of EPROM cells and a select transistor portion formed adjacent to the cell array portion and electrically connected to the cell array portion for controlling operations of the cell array portion, the AMG EPROM device structure comprising:

a layer of silicon dioxide formed on the surface of the silicon substrate in both the cell array portion and the select transistor portion of the device structure;

a plurality of spaced-apart, parallel islands of oxide/nitride/oxide (ONO) and underlying floating gate polysilicon (poly1) formed on the silicon dioxide layer in the cell array portion of the device structure;

a plurality of parallel buried bit lines of N-type conductivity formed in the silicon substrate in the cell array portion between the parallel ONO/poly1 islands, each of the bit lines having a section that extends into the select transistor portion of the device structure, alternating bit lines being contacted by conductive contacts to provide drain bit lines of the EPROM cell matrix, the non-contacted bit lines providing source bit lines of the EPROM cell matrix;

a plurality of spaced-apart, parallel polysilicon word lines (poly2) formed perpendicular to and overlying the ONO/poly1 islands such that the polysilicon word lines are separated from the floating gate poly1 by the ONO, and such that the combination of a selected drain bit line, a selected source bit line adjacent to the selected drain bit line, the ONO/poly1 islands formed between the selected drain bit line and the selected source bit line and the poly2 word lines overlying said ONO/poly1 islands define a segment of EPROM cells in the EPROM cell matrix;

polysilicon select lines formed on the silicon dioxide layer in the select transistor portion of the device structure and perpendicular to and overlying the bit line extending into the select transistor portion to thereby define first and second rows of MOS select transistors; and localized isolation trenches formed in the silicon substrate between adjacent MOS select transistors in each of the first and second rows of select transistors to electrically isolate said adjacent MOS select transistors.

2. An AMG EPROM device structure as in claim 1 wherein the bit lines are formed in the silicon substrate to a first depth and the isolation trenches are formed in the silicon substrate to a second depth which is deeper than the first depth.

3. An AMG EPROM device structure as in claim 1 wherein the isolation trenches are self-aligned to the bit line oxide.

4. An AMG EPROM device structure as in claim 1 whereby bit line to bit line isolation of 0.6 $\mu$m and below is achieved without compromising either data retention or memory performance.

* * * * *

UNITED STATES PATENT AND TRADEMARK OFFICE
CERTIFICATE OF CORRECTION

PATENT NO. : 5,313,419
DATED : May 17, 1994
INVENTOR(S) : Ming-Bing Chang

It is certified that error appears in the above-indentified patent and that said Letters Patent is hereby corrected as shown below:

In Col. 2, line 11, the words "below to achieve a 64 Mbit EPROM array." should be added after the word "and".

Signed and Sealed this

Fourth Day of October, 1994

*Attest:*

BRUCE LEHMAN

*Attesting Officer*  *Commissioner of Patents and Trademarks*